United States Patent
Dupont et al.

(10) Patent No.: US 7,452,745 B2
(45) Date of Patent: Nov. 18, 2008

(54) PHOTODETECTING DEVICE

(75) Inventors: Frédéric Dupont, Grenoble (FR); Ian Cayrefourcq, St. Nazaire les Eymes (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 203 days.

(21) Appl. No.: 11/510,870

(22) Filed: Aug. 24, 2006

(65) Prior Publication Data

US 2007/0018266 A1 Jan. 25, 2007

Related U.S. Application Data

(63) Continuation of application No. PCT/IB2004/000905, filed on Feb. 25, 2004.

(51) Int. Cl.
*H01L 21/00* (2006.01)
(52) U.S. Cl. .............. 438/67; 438/455; 257/E21.088; 257/E21.122
(58) Field of Classification Search .............. 438/66, 438/67, 129, 455, 464, 107; 257/E21.088, 257/E21.122, E21.48
See application file for complete search history.

(56) References Cited

U.S. PATENT DOCUMENTS

| | | | | |
|---|---|---|---|---|
| 5,084,747 A | | 1/1992 | Miyawaki | 357/30 |
| 5,324,980 A | * | 6/1994 | Kusunoki | 257/74 |
| 5,808,329 A | | 9/1998 | Jack et al. | 257/188 |
| 5,936,261 A | | 8/1999 | Ma et al. | 257/59 |
| 6,040,591 A | | 3/2000 | Otsuka | 257/233 |
| 6,204,205 B1 | | 3/2001 | Yu et al. | 438/787 |
| 6,252,218 B1 | | 6/2001 | Chou | 250/208.1 |
| 6,292,529 B1 | * | 9/2001 | Marcovici et al. | 378/19 |
| 6,309,968 B1 | | 10/2001 | Chu et al. | 438/660 |
| 6,328,796 B1 | | 12/2001 | Kub et al. | 117/94 |
| 6,358,866 B1 | | 3/2002 | Stesmans et al. | 438/770 |
| 6,380,568 B1 | | 4/2002 | Lee et al. | 257/251 |
| 6,649,538 B1 | | 11/2003 | Cheng et al. | 438/775 |
| 6,737,730 B1 | | 5/2004 | Lane et al. | 257/640 |
| 6,831,264 B2 | | 12/2004 | Cazaux | 250/214 R |
| 2001/0026001 A1 | | 10/2001 | Yagi | 257/447 |

(Continued)

FOREIGN PATENT DOCUMENTS

| | | |
|---|---|---|
| DE | 198 38 442 C1 | 3/2000 |
| EP | 0 820 104 A2 | 1/1998 |
| EP | 0 964 570 A2 | 12/1999 |
| JP | 2000-036445 | 2/2000 |
| JP | 2006-049725 | 2/2006 |

OTHER PUBLICATIONS

Q.-Y. Tong et al., "Semiconductor Wafer Bonding: Science And Technology", John Wiley & Sons, Inc. pp. 1-99 (1999).

(Continued)

*Primary Examiner*—Quoc D Hoang
(74) *Attorney, Agent, or Firm*—Winston & Strawn LLP

(57) ABSTRACT

A method of manufacturing a photodetecting device, by providing a first wafer that includes a photosensitive layer made of a semiconductor material and a second wafer that includes a circuit layer of electronic components, with one of the photosensitive layer or the circuit layer incorporating a field isolation layer; bonding the first and second wafers to form a structure comprising successively the circuit layer, the field isolation layer and the photosensitive layer; and forming electrically conductive vias to electrically connect the photosensitive layer to at least some of the electronic components of the circuit layer. Also, photodetecting devices prepared by these methods.

25 Claims, 5 Drawing Sheets

U.S. PATENT DOCUMENTS

| | | | |
|---|---|---|---|
| 2003/0013266 A1 | 1/2003 | Fukuda et al. | 438/400 |
| 2003/0064735 A1 | 4/2003 | Spain et al. | 455/456 |
| 2003/0129817 A1 | 7/2003 | Visokay et al. | 438/591 |
| 2004/0222500 A1 | 11/2004 | Aspar et al. | 257/629 |
| 2005/0118789 A1 | 6/2005 | Aga et al. | 438/459 |
| 2006/0051945 A1 | 3/2006 | Yokokawa et al. | 438/526 |
| 2006/0154442 A1 | 7/2006 | De Souza et al. | 438/455 |

OTHER PUBLICATIONS

Schjølberg-Henriksen, K. et al., "Oxide Charges Induced By Plasma Activation For Wafer Bonding", Sensors and Actuators, vol. A 102, pp. 99-105 (2002).

Colinge, J. P., "Silicon-On-Insulator Technology", Materials to VLSI, 2nd Edition, pp. 50-51 (1997).

A. Misiuk et al., " Effect of High Temperature—Pressure on SO1 Structure", Crystal Engineering, vol. 5, pp. 155-161 (2002).

K.-Y. Ahn et al., "Stability of Interfacial Oxide Layers During Silicon Wafer Bonding", Journal of Appl. Phys., vol. 65, No. 2, pp. 561-563 (1989).

Oleg Kononchuk et al., "Internal Dissolution of Buried Oxide SO1 Wafers", Solid State Phenomena, vol. 131-133, pp. 113-118 (2008).

Jim Sullivan et al., "High Temperature Oxygen Out-Diffusion from the Interfacial SiOx Bond Layer in Direct Silicon Bonded (DSB) Substrates", IEEE 2006 International SOI Conference.

* cited by examiner

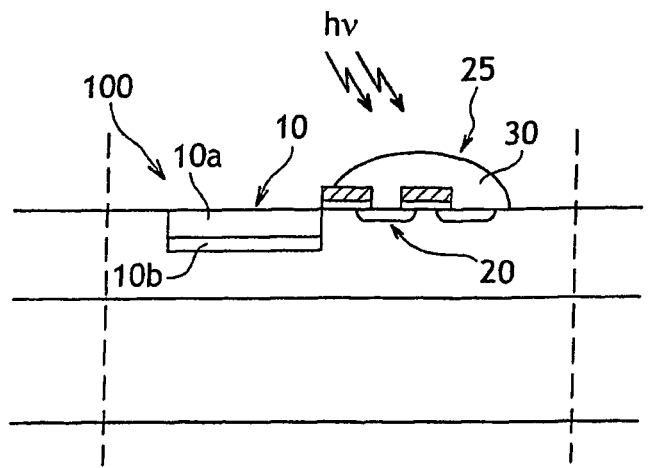
FIG.1a
(PRIOR ART 1)
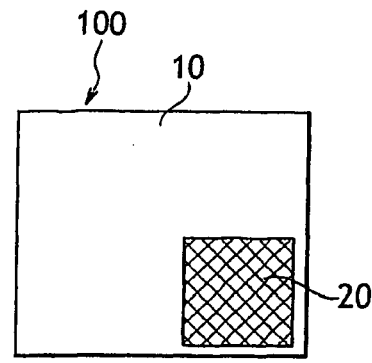
FIG.1b
(PRIOR ART 1)
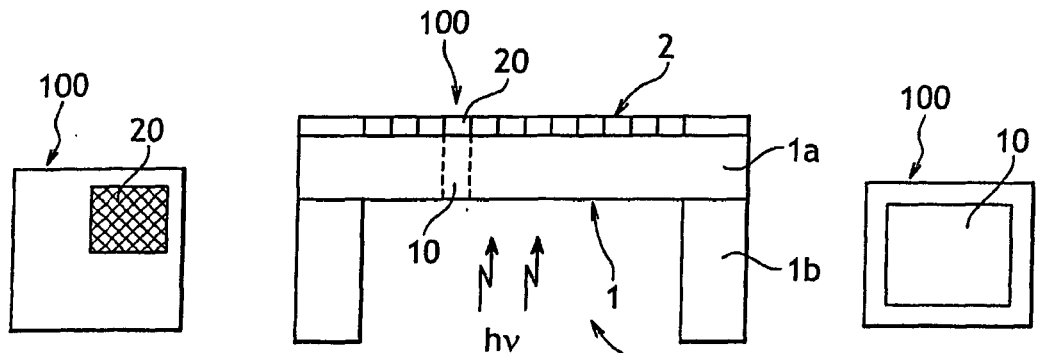
FIG.2c
(PRIOR ART 2)
FIG.2a
(PRIOR ART 2)
FIG.2b
(PRIOR ART 2)
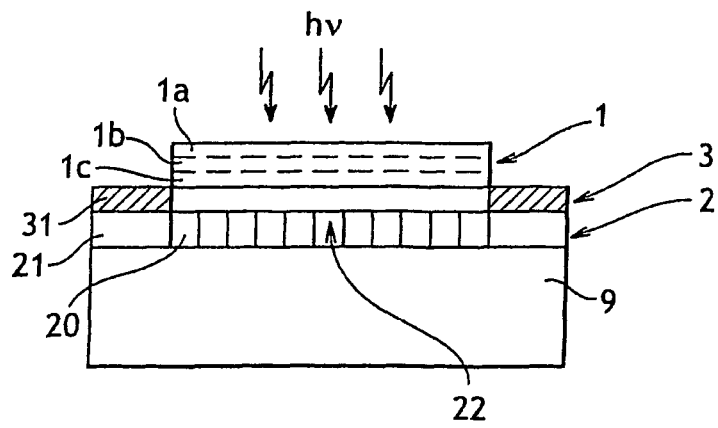
FIG.3
(PRIOR ART 3)

PHOTODETECTING DEVICE

CROSS-REFERENCE TO RELATED APPLICATION

This application is a continuation of International application PCT/IB2004/000905 filed Feb. 25, 2004, the entire content of which is expressly incorporated herein by reference thereto.

FIELD OF THE INVENTION

The invention relates to a manufacturing of a photodetecting device, comprising a photosensitive part and an electronic circuit part, such as a CMOS image sensor. Such a photodetecting device comprises a plurality of photodetecting units, also called pixels, which are usually arranged in rows and columns. Each of the photodetecting units comprises a photosensitive part, like a photodiode, at its surface, able to convert the received photons to an electronic signal; and at least one electronic part, like a transistor, electrically connected to the photosensitive part, able to process, once-having received a command "ON", the accumulated electronic charges coming from the latter to other components (amplificatory, switch, . . . ) to readout means (for more details, see for instance U.S. Pat. No. 6,831,264.

One of the main advantages of this technology is the rapid readout of the light information, due to a light acquisition in parallel over the different units.

BACKGROUND OF THE INVENTION

Several kinds of structural configuration of photodetecting devices have been proposed. As disclosed for example in U.S. Pat. No. 6,380,568, a first known photodetecting device has a horizontal configuration, i.e., each photosensitive unit (or pixel) comprises on its surface, side by side, a photosensitive element and an electronic element, separated by a field isolation layer.

FIG. 1a illustrates such a pixel 100, having a photodiode 10 (composed here, for example, of a p-type layer 10a and a n-type layer 10b), able to convert the received photons (hv) in electronic charges and, beside, a transistor 20 (surrounded by a field isolation layer 30) able to receive the electronic charges from the photodiode 10a.

As shown on FIG. 1b, which represents a front view of the photoreceiver pixel surface 100, the latter comprises a photosensitive part 10 and a non-photosensitive part 25. Typically, the photosensitive surface represents 30% to 60% of the entire pixel surface. Consequently, the photosensing is not optimized, since a part of the photons arriving on the pixel are lost.

One solution to this would be to reduce the size of the electronic part 20. But such miniaturization has its own technical limits. Furthermore, even if the electronic part is drastically reduced in size, the surface of the pixel 100, in such a horizontal configuration, will not be dedicated to photosensing by 100%.

It was proposed to add a lens over each pixel for focusing the entire light, arriving on the pixel, to the photosensitive element; as disclosed in U.S. Pat. No. 6,040,591. But this solution is not desirable, due to its high cost and to its insufficient efficiency.

A second kind of known, photosensitive device is the so-called "back-illuminated" device. FIG. 2a illustrates this device which initially comprises a doped substrate (for instance a p+-type) covered by a top layer 1a having another type of doping (for instance a p--type), and an electronic circuit layer 2 (including a plurality of transistors 20). The substrate is then selectively back-etched, such as to preserve the periphery 1b, and thus forming a central opening 15. The periphery 1a of the substrate then holds a thin structure comprising the top layer 1a and the circuit layer 2. This structure allows the thin top layer 1a to receive the photons coming from the "back" (i.e., passing through the opening 15) and delivering an electronic signal associated with this photon illumination to the transistors 20 included in the overlying circuit layer 2.

From FIGS. 2b and 2c, which represent respectively front views of the surface of a pixel 100 and of the opposite surface, it appears that this device does not have the drawbacks of the first photodetecting device, as the transistor 20 is not on the photoreceiving surface, the latter being then close to 100% dedicated to photosensing. However, the manufacturing of this second photodetecting device is high and implies the loss of an important part of the back substrate during the etch-back process.

A third known photodetecting device has a vertical configuration, i.e., the electronic part is buried under the photosensitive part, as disclosed for instance in European Patent Application 964,570 or in U.S. Pat. Nos. 6,831,264, 6,252, 218, and 5,084,747. FIG. 3 illustrates such photodetecting device which is fabricated from a substrate 9 from which an electronic circuit layer 2 is formed (by crystal growth, doping, plating, deposition, . . . ). This circuit layer 2 usually comprises a circuit central part 22 including the transistors 20 of each pixel and a peripheral part 21 comprising electronic components dedicated to addressing (i.e., collecting the signals from the pixels and sending them to readout means). The circuit layer 2 is covered by an isolation layer 3, mainly of a dielectric material with a shielding 31 on the periphery for protecting the peripheral part 21 from illumination. The isolation layer 3 comprises electrical conductor channels (not shown), so called "via hole", so as to electrically link the photosensitive part to the electronic part.

A doped photosensitive layer 1 (for instance a PiN structure composed of a p-type layer 1a, an intrinsic layer 1b and a n-type layer 1c) is formed on the isolation layer 3. Due to the non-crystallinity of the isolation layer 3, a crystal growth of the photosensitive layer 1 is not possible. So, the photosensitive layer 1 is formed by deposition, and has an amorphous structure. Now, an amorphous layer comprises many charges traps able to immobilize electrons and holes during a time, so called "time of relaxation". These trapped charges slow down the reception and interfere with the next detections. The average number of electrons generated by incoming photons is then lower for non crystalline layers, from which it follows a lower efficiency for this type of device and leads to a less sensible detector.

Accordingly improvements in these type detectors are needed, and these are now provided by the present invention.

SUMMARY OF THE INVENTION

The invention relates to a method of manufacturing a photodetecting device, by providing a first wafer that includes a photosensitive layer made of a semiconductor material and a second wafer that includes a circuit layer of electronic components, with one of the photosensitive layer or the circuit layer incorporating a field isolation layer; bonding the first and second wafers to form a structure comprising successively the circuit layer, the field isolation layer and the photosensitive layer; and forming electrically conductive vias to electrically connect the photosensitive layer to at least some of the electronic components of the circuit layer.

The invention also relates to a photodetecting device manufactured by the methods disclosed herein. This device comprises a circuit layer comprising electronic components, a photosensitive layer, a field isolation layer between the photosensitive layer and the circuit layer, including conductive via which electrically connect the photosensitive layer to inputs of some electronic components of the circuit layer, wherein the photosensitive layer is made of a crystalline semiconductor material. a particular characteristic of the said photodetecting device could be that the said photosensitive layer is buried, a holding substrate of a transparent material to photons being located on the photoreceiving side of the photosensitive layer.

BRIEF DESCRIPTION OF THE DRAWINGS

Other characteristics, purposes and advantages of the invention will appear in the next detailed description of the invention, illustrated by the following drawings:

FIG. 1a is a schematic cross-sectional view of a photodetecting device according to a first prior art.

FIG. 1b is a schematic front view of the surface, of the photodetecting device according to the first prior art, which detects photons.

FIG. 2a is a schematic cross-sectional view of a photodetecting device according to a second prior art.

FIGS. 2b and 2c are respectively schematic front views of the surface of the photodetecting device according to the second prior art, which detects the photons and the opposite surface.

FIG. 3 is a schematic cross-sectional view of a photodetecting device according to a third prior art.

DETAILED DESCRIPTION OF THE PREFERRED EMBODIMENTS

Figure 4:
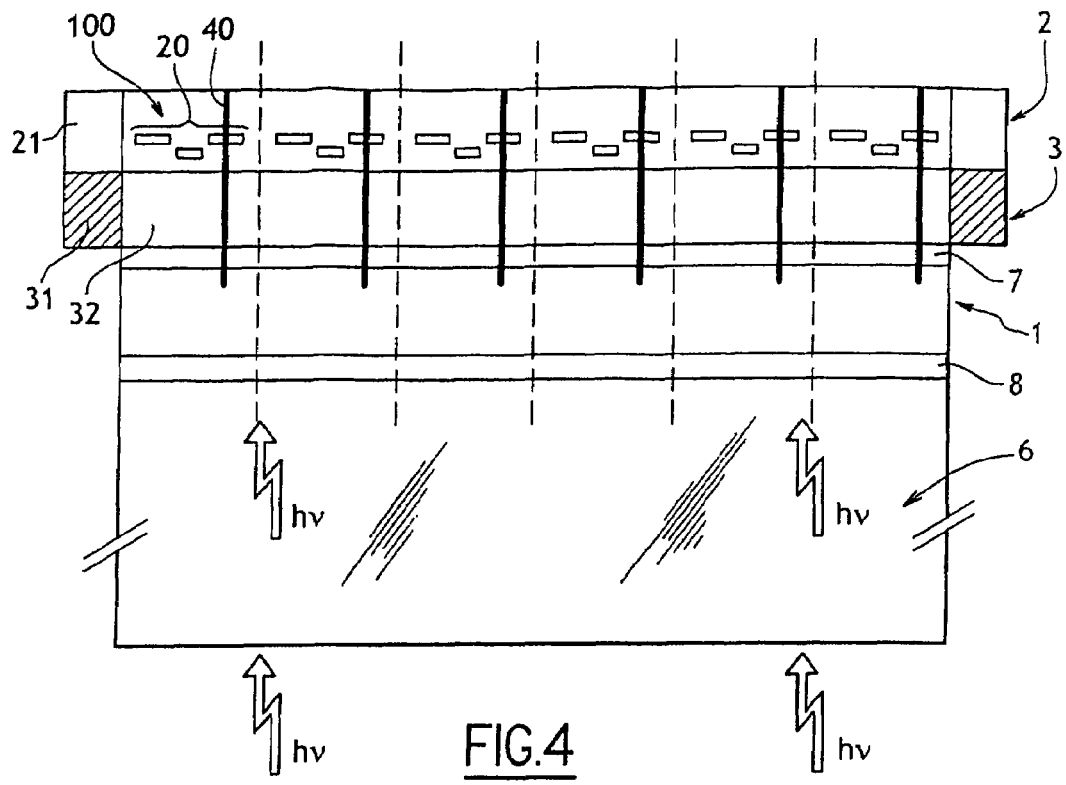
FIG. 4 is a schematic cross-sectional view of a first detecting device according to the invention.

The photodetecting device manufacturing method generally comprises the following steps: (a) providing a first wafer comprising a photosensitive layer made of a material chosen from semiconductor materials, and a second wafer comprising a circuit layer including electronic components, one of the photosensitive layer and the circuit layer being covered by a field isolation layer; (b) bonding the first wafer and the second wafer so as to form a structure comprising successively the circuit layer, the field isolation layer and the photosensitive layer; (c) forming electrically conductive via so as to electrically connect the photosensitive layer to inputs of some electronic components of the circuit layer.

Other characteristics of the invention are the following ones:
- step (b) comprises a molecular adhesion;
- step (b) comprises, after the molecular adhesion, a thermal treatment, the material which constitutes the field isolation zone being chosen for improving the bonding when this thermal treatment is processed;
- the material chosen for the field isolation zone is a dielectric, such as $SiO_2$, $Si_3N_4$ or $Si_xO_yN_z$;
- a first method further comprises, before step (a), a formation of the first wafer comprising the following steps: forming the photosensitive layer on a first substrate; bonding the photosensitive layer with a holding substrate of a transparent material, such as quartz or glass, from the photoreceptive side of the photosensitive layer; removing the first substrate; the said first wafer thus comprising the photosensitive layer and the holding substrate;—the said first method further comprises: before step of forming the photosensitive layer, a formation of a first electrode layer made of an electrical conductive material on the first substrate; after step of forming the photosensitive layer and before step of bonding with the holding substrate, a formation of a second electrode layer made of a transparent electrical conductive material, such as ITO, on the photosensitive layer; the said first wafer further comprising the first and the second electrode layers;
- the first method further comprises the following steps: /before step (a), forming the said circuit layer on a second substrate, forming thus the said second wafer; after step (b), removing the said second substrate;
- during this first method, via holes are formed during step (c) through the surface of the circuit layer, passing through inputs of some electronic components of the circuit layer, to the photosensitive layer;
- a second method comprises the following steps : before step (a), forming the photosensitive layer on a first substrate, forming thus at least a part of the said first wafer; /after step (b), removing the first substrate;
- the second method further comprises: before step (b), a formation of a first electrode layer made of an electrical conductive material on the photosensitive layer; /after step of removing the first substrate, a formation of a second electrode layer made of a transparent electrical conductive material, such as ITO, on the photosensitive layer; the said first wafer further comprising the first and the second electrode layers;
- during this second method, the via holes are formed during step through the surface of the photosensitive layer to inputs of some electronic components of the circuit layer;
- the step of removing substrate is operated by at least one of the following techniques: chemical etching, selective chemical etching, grinding, polishing, CMP;
- the step of removing substrate comprises an energy input for detaching the said substrate over an embrittlement zone previously formed in the said substrate;
- the method further comprises a formation of the said embrittlement zone in the said substrate by implantation of atomic species, such as hydrogen and/or helium;
- the method further comprises a formation of the said embrittlement zone by the following steps: providing a third and a fourth wafers; etching a surface of at least one of the third and the fourth wafers, in order to increase the surface roughness; bonding the third and the fourth wafers at the rough surface(s), forming thus the said substrate, the rough interface being the said embrittlement zone;
- the method further comprises a surface finishing step of the detached surface, employing at least one of the following techniques: selective chemical etching, polishing, CMP, oxidation, thermal anneals;
- the formation of the photosensitive layer on the first substrate comprises crystal growth and doping;

the method further comprises, before step, a formation of the isolation layer on the photosensitive layer or on the circuit layer;

the formation of the field isolation layer comprises the formation of a shielding to photons in periphery of the field isolation layer over a determinate width;

the circuit layer comprises a plurality of transistors, and in that the circuit layer is patterned such that, once step (c) is implemented, parts of the photosensitive layer are electrically connected to some transistors by some conductive via, forming thus a plurality of photodetecting units (so-called pixels);

the electronic components by pixel comprise CMOS component.

A first object of the invention is the manufacturing of a photodetecting device having vertical configuration, comprising a photosensitive layer made of a crystalline semiconductor material.

A second object of the invention is to process a method of manufacturing such photodetecting device so that the photosensing surface is 100% dedicated or closed to 100% dedicated to photosensing.

Figure 5:
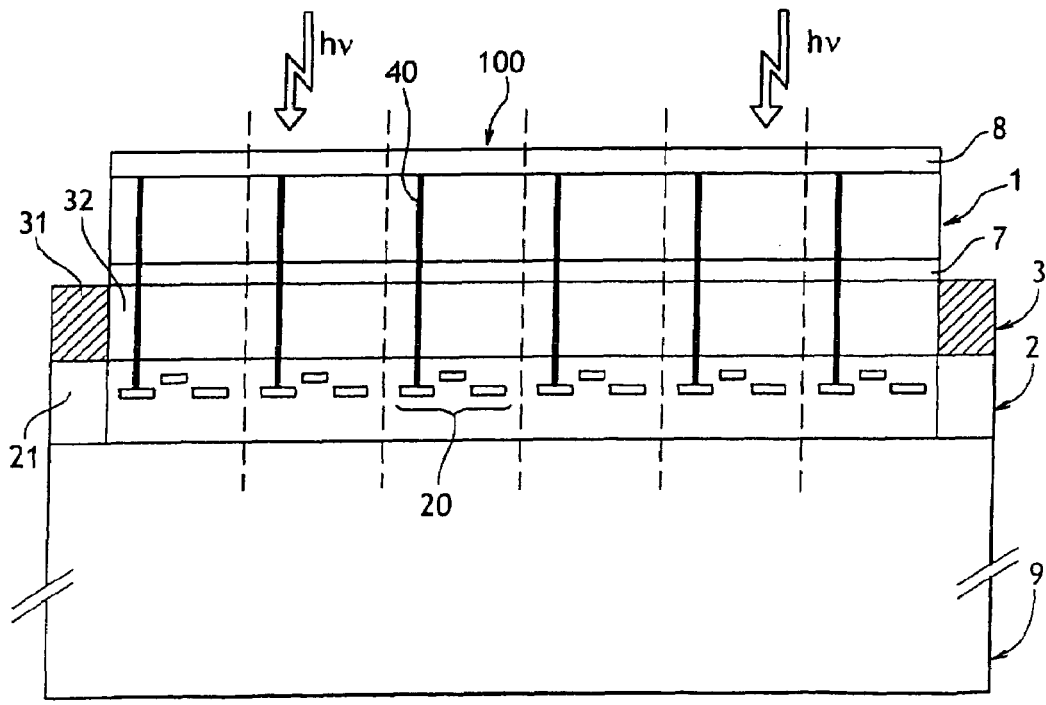
FIG. 5 is a schematic cross-sectional view of a second photodetecting device according to the invention.

FIGS. 4 and 5 respectively show a first and a second photodetecting device according to the invention, comprising a photosensitive layer 1, an electronic circuit layer 2, and a field isolation layer 3 separating the photosensitive layer I and the circuit layer 2. Preferably, the photosensitive layer 1 is made of monocrystalline semiconductor material, like Si, Si, Ge, or some III-V or II-VI alloys.

As the photosensitive layer 1 acts as a photodiode, it has at least one electrical junction, and thus comprises doping elements whose nature and/or concentration suddenly changes in the thickness of the photosensitive layer 1. The photosensitive layer 1 can then be a PN-type junction, a PP+-type junction, a NN--type junction, a PiN-type junction, or other type of junctions. In order to facilitate or allow conversion of the received photons to electronic charges, the photosensitive layer 1 is preferably covered and underlied by electrode layers respectively 8 and 7, for biasing it. One electrode layer 8, located on the photoreceiving side of the photosensitive layer 1, has to be transparent to permit at least part of the photons to cross it, and thus to permit the underlying photosensitive layer 1 to receive them. This electrode layer 8 can be for instance made of ITO (Indium Tin Oxide) or another dielectric material. The other electrode layer 7 can be of any electrical conductive material, such as aluminum, titanium or an alloy of Ti and W such as TiW.

The circuit layer 2 includes the whole electronic components that receive, and optionally amplify, switch and command electrical charges coming from the photosensitive layer 1. This circuit layer 2 has preferably two areas: a central zone 22 which includes electronic components of the pixels 100, and a peripheral zone 21 which includes the electronic components dedicated to the addressing process of the different pixels or electronic components located in the central zone 22.

Each photodetecting unit 100 (or pixels 100) comprises at least one electronic component 20 (illustrated in FIGS. 4 and 5 as a transistor) and the part of the photosensitive layer 1 which is directly above the at least electronic component 20. In a pixel 100, the part of photosensitive layer 1 and the at least electronic component 20 are electronically linked by a via hole 40, a via hole 40 being an electrically conductive channel. The via hole 40 can be for instance filled with Al, Ti or an alloy of Ti and W such as TiW, or other conductive materials. This via hole 40 allows to link the photosensitive layer 1 to the input of the at least electronic component 20 (illustrated in FIGS. 4 and 5 as the source of a transistor 20).

A field isolation layer 3 separates the photosensitive layer 1 from the circuit layer 2, and comprises, at its peripheral part 31 a shielding whose function is the protection of the peripheral zone 21 of the circuit layer 2 (and the included addressing components) from the outside illumination. Material chosen for shielding may be all non transparent material at the considered wavelength, for instance tungsten or nickel. The central zone 32 of the isolation layer 3 electrically separates the circuit layer 2 from the photosensitive layer 1, except for the via holes 40 which passes through. The central zone 32 can be of a dielectric material, such as $SiO_2$, $Si_3N_4$ or $Si_xO_yN_z$.

Further to the three preceding layers (i.e. photosensitive layer 1, circuit layer 2 and isolation layer 3), the photodetecting device preferably comprises a holding substrate which mechanically stiffens the whole device. FIG. 4 shows a first photodetecting device according to the invention, wherein the holding substrate 6 is located on the side of the photosensitive layer 1. For allowing the photons to reach the photosensitive layer 1, this holding substrate 6 has to be made of a transparent material to photons, as glass or quartz or any other material transparent to the wavelength of interest. This first photodetecting device is then illuminated "by the back". Furthermore, it allows electrical contacts directly to the electronic components 20 of the uncovered circuit layer 2.

FIG. 5 shows a second photodetecting device according to the invention wherein the holding substrate 9 is located on the side of the circuit layer 2. The holding substrates 9 can be in any material, like a semiconductor material, as Si. This second photodetecting device is then illuminated "by the front".

The photodetecting device of the present invention does not necessarily comprise a photosensitive layer 1 in an amorphous semiconductor material, but can comprise a photosensitive layer 1 of crystalline semiconductor material, even if the underlying layer (electrode layer 7 or 8 and/or isolation layer 3) is not of a crystalline material, contrary to the photodetecting device of the prior art wherein the photosensitive layer 1 has to be in an amorphous material because of the non possibility of growing a crystalline material from a non-crystalline surface. The photodetecting device according to the invention then improves the reliability and the efficiency of the photosensitive layer 1, as crystalline semiconductor material does not comprise any charge-traps like in an amorphous material, and consequently does not present problems of a low average number of electrons generated by incoming photons like in amorphous and then it leads to a more sensible detector.

Figure 6A:
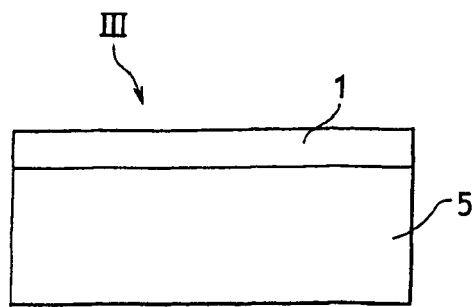
FIGS. 6a to 6m are the different steps of a first method of manufacturing the first photodetecting device according to the invention.

FIGS. 6a to 6m show several steps of a first method of manufacturing a photodetecting device (the first photodetecting device referring to FIG. 4). Referring to FIG. 6a, a first step comprises providing a semiconductor substrate 5 on which the photosensitive layer 1 is grown, in order to make a donor substrate 111. The first substrate 5 is preferably a monocrystalline substrate which can be made of a bulk material (like Si or AsGa) or made of different sorts of materials like a first substrate 5 comprising a bulk substrate Si and a buffer structure (which confines plastic defaults and adapts the lattice parameter) in SiGe. In any case, the first substrate 5 presents a top surface preferably monocrystalline with little plastic defaults.

The photosensitive layer 1 is then grown by any known epitaxial techniques, such as CVD techniques, as PECVD, MOCVD, LEPCVD. etc. In a variant, the photosensitive layer 1 is formed by deposition in order to make a non crystalline photosensitive layer 1 like other amorphous structures.

In order to create the electrical junction in the photosensitive layer 1, steps of doping succeeds to the growth step, such that the photosensitive layer 1 comprises at least two levels of doped zones, a doped zone having a doping element with different concentration and/or different nature from the other doped zones. Thus, the photosensitive layer 1 can present a PN junction, a NN− junction, a PP+ junction, a PiN junction, etc., depending on the requirement.

Figure 6B:
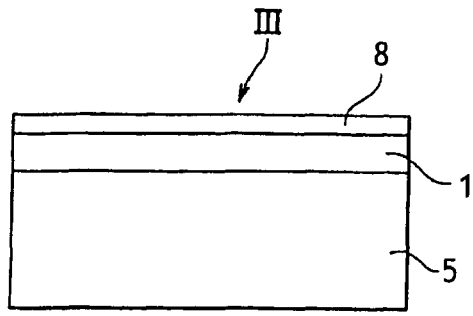
Figure 6C:
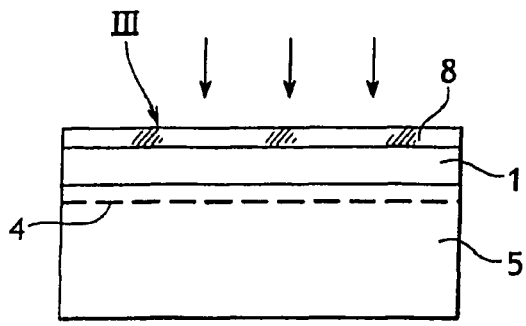

Referring to FIG. 6b, a first electrode layer 8 is optionally formed on the photosensitive layer 1. This electrode layer 8 is made of a transparent conductive layer, such as ITO. Referring to FIG. 6c, an implanting step consists in implanting atomic species like hydrogen and/or helium ions, through the top surface of the donor substrate 111, so as to create in the first substrate 5 an embrittlement zone 4. The concentration and the energy of the atomic species are chosen such that the embrittlement zone 4 is located in the first substrate 5 and presents some mechanical weakness comparing with the other part of the donor substrate 111.

Figure 6D:
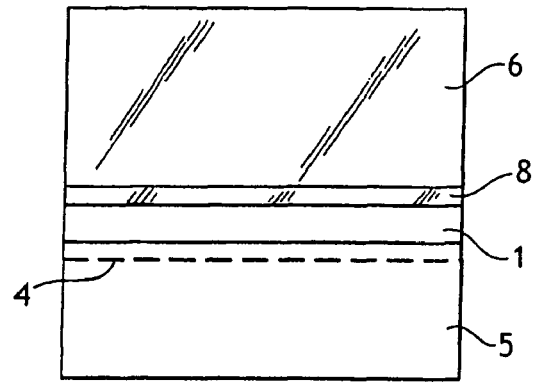

Referring to FIG. 6d, a holding substrate 6 is provided and bonded to the donor substrate 111. This holding substrate 6 is made of a material transparent to photons that the photodetecting device will receive, such as glass or quartz. Before bonding, the donor substrate 111 and/or the holding substrate 6 can be polished or cleaning in order to reduce the rugosity. The bonding can be realized by molecular adhesion, which is mainly due to hydrophilicity of the surfaces to be bonded. Preparation of the surface(s) to be bonded can be optionally done for improving the bonding energy between the holding substrate 6 and the donor substrate III, such as for example an exposition to a plasma (of oxygen for example), a cleaning, a brushing, etc. For further details of the technique of bonding that can be used, reference can be made to the book "Semiconductor Wafer Bonding Science and Technology" of Q-Y Tong and U. Gosele (a Wiley Interscience publication, Johnson Wiley and Sons, Inc.). The bonding interface can be optionally strengthened by a thermal treatment, at a low bonding temperature for instance 600° C. to 900° C. for 1 hour. In addition, bonding could be assisted by a plasma activation.

Figure 6E:
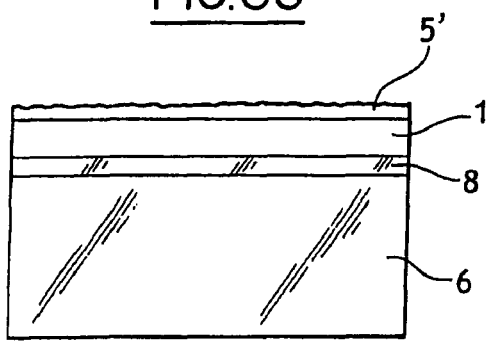

Referring to FIG. 6e, the first substrate 5 is reduced by bringing some energy at the embrittlement zone 4 in order to create a detachment of the major part of the first substrate 5. The energy provided can be for instance mechanical energy and/or thermal energy or other kind of energy.

A first alternative of reduction of the first substrate 5 can also be processed, in which the formation of the embrittlement zone 4 is differently done than by implanting atomic species (as illustrated in FIG. 6c), but by implementing, before the formation of the photosensitive layer 1 (referring to FIG. 6a), the following steps: providing two wafers, etching a surface of at least one of the two wafers, in order to increase the surface roughness, and bonding the two wafers; thus forming the first substrate 5, the rough interface being the embrittlement zone 4.

The fabrication of such a first substrate 5, also called a "dismountable substrate", by controlling of the bonding energy, is described for example in US patent application publication no. 2004/0222500, the principle being based on a reduction of the bonding forces between the two wafers that are bonded together, relative to an optimal bonding. Then the detaching of the major part of the first substrate 5 is substantially processed as above in FIG. 6d.

A second alternative of reduction of the first substrate 5 is the etch-back technique (i.e., a chemical etching from the back of the first substrate 5).

Figure 6F:
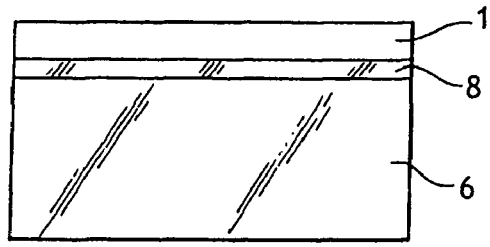

Whatever techniques of reduction of the first substrate 5 used, after having reduced the first substrate 5, a remaining part 5' of the first substrate 5 stays (referring to FIG. 6e) and is removed by finishing techniques such as polishing, selective etching, CMP, oxidation, etc. in order to obtain a structure composed of the holding structure 6, the optional transparent first electrode layer 8, and the photosensitive layer 1, as shown in FIG. 6f.

Figure 6G:
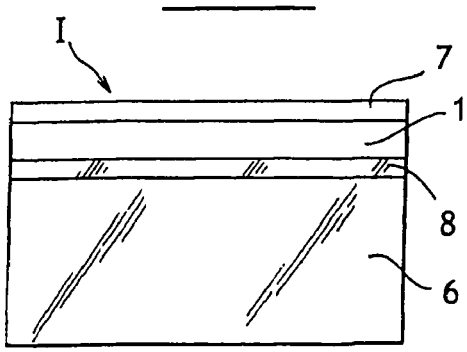

Referring to FIG. 6g, an optional second electrode layer 7 is formed on the photosensitive layer 1, this second electrode layer 7 being made of an electrically conductive material, such as Al, Ti or an alloy of Ti and W such as TiW. The technique for forming this second electrode 7 can be an electroplating.

Figure 6H:
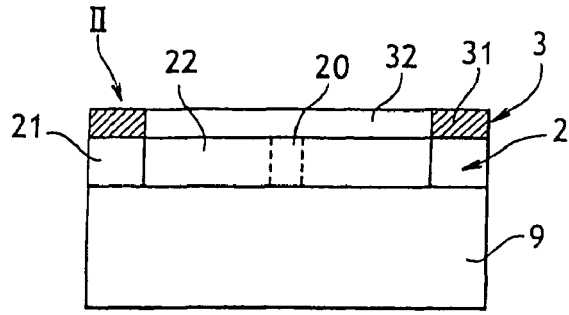

Referring to FIG. 6h, a second wafer 11 is formed by providing a second substrate 9, on which a circuit layer 2 is formed. The second substrate 9 is preferably made of a monocrystalline material such as a bulk material like Si, or a composite substrate comprising for instance a buffer structure. On the second substrate 9, is formed an electronic circuit layer 2, such that a central part 22 includes the whole electronic components of the different pixels 100, and a peripheral part 21 including the electronic components dedicated to the addressing. Techniques employed for manufacturing those components are conventional ones, as for instance epitaxy, doping, depositing, electroplating, etc.

The layout of the circuit layer 2 is chosen to process the electronic charges coming from the photosensitive layer 1 (which will next overly the circuit layer 2), choosing thus in consequence a circuit configuration and a path for the metallic tracks, inside the circuit layer 2. For example, a CMOS circuit can be manufactured in each pixel 100. A field isolation layer 3 is then formed on the circuit layer 2, this isolation layer 3 comprising a peripheral part 31 of shielding for protecting the underlying peripheral part 21 of the circuit layer 2, and a central part 32 which covers the central part 21 of the circuit layer 2.

The shielding material chosen for the peripheral part 31 of the isolation layer 3 may be all non transparent material at the considered wavelength, for instance tungsten or nickel. The material chosen for the central part 32 of the isolation layer 3 is preferably made of a dielectric material as $SiO_2$, $Si_3N_4$ or $Si_xO_yN_z$. This isolation layer 3 will then electrically separate the circuit layer 2 from the photosensitive layer 1 (which will next underlie the isolation layer 3).

Figure 6I:
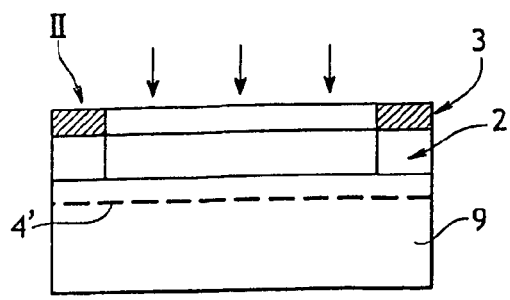

Referring to FIG. 6i, implanting step is processed inside the second substrate 9 (like the implanting step in the substrate 5 described above, referring to FIG. 6c) in order to create a second embrittlement zone 4' in the second substrate 9.

Figure 6J:
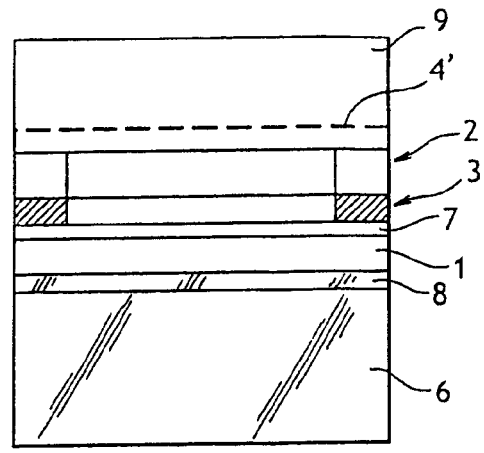

Referring to FIG. 6j, the second wafer 11 and the first wafer 1 are then bonded. The technique of bonding used for this step is similar to the technique of bonding used during step referring to FIG. 6d described above. Some energy is provided in order to detach a major part of the second substrate 9, this energy can be mechanical energy, and/or thermal energy, or other kind of energy. The above-mentioned two other alternatives for the reduction of the first substrate 5, can also be adapted to the reduction of the second substrate 9.

Figure 6K:
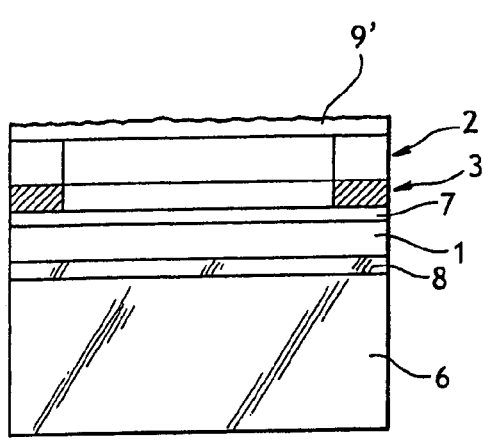
Figure 6L:
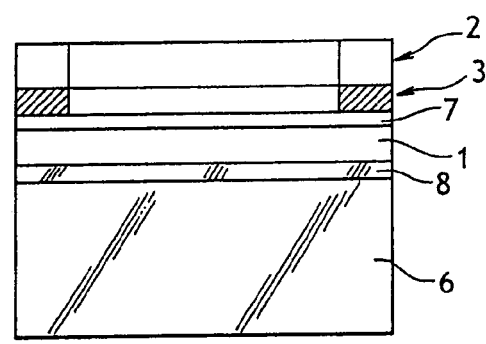

Referring to FIGS. 6k and 6l, after having reduced the second substrate 9, the remaining part 9' of it is then removed by some technique of surface finishing, such as polishing, selective etching, CMP, oxidation, thermal anneals, etc.

Figure 6M:
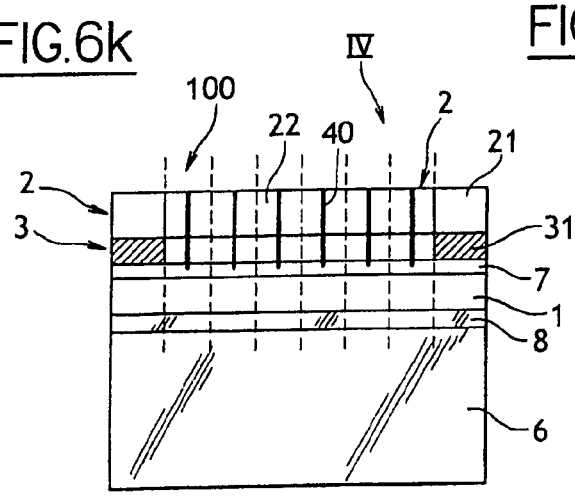

Referring to FIG. 6m, the photodetecting device is finally obtained by forming via holes from the surface of the circuit layer 2 to the photosensitive layer 1 (by technique of masks and etching through the non-masked surface of the circuit layer 2) and by filling them with an electrical conductive layer, such as Al, Ti, or an alloy of Ti and W such as TiW, or another material, in order to create conductive vias 40 between the input of some electronic components included in the central part 22 of the circuit layer 2, and the photosensitive layer 1, forming thus the said first photodetecting device (referring to FIG. 4).

Referring to FIGS. 7a to 7h, a second method of manufacturing a photodetecting device (for obtaining the said second photodetecting device referring to FIG. 5), is proposed according to the invention. After having formed the photosensitive layer 1 and a first substrate 5 (referring to FIG. 7a) in order to form a first wafer 1, a first electrode layer 7 is formed on the photosensitive layer 1 (referring to FIG. 7b). This first electrode layer 7 is non-transparent to photons (contrary to the first electrode layer 8 referring to FIG. 6b of the said first method of manufacturing according to the invention).

After having implanting atomic species in the first wafer I and having formed a second wafer II that includes a holding substrate 9, a circuit layer 2 and a field isolation layer 3 (with techniques substantially and respectively similar to those above-described referring to FIGS. 6c and 6h). Then, referring to FIG. 7e, the first wafer I is directly bonded to the second wafer II for obtaining a structure comprising successively a circuit layer 2, a field isolation layer 3, an optional first electrode layer 7 and a photosensitive layer 1.

It is noticed that, contrary to the first method of manufacturing a photodetecting device, this second method does not comprise steps of providing and bonding a transparent holding substrate 6 previously to the bonding between the first and second wafers I-II (referring to FIG. 6d). After having reduced the first substrate 5 (with the same technique as above described referring to FIGS. 6c and 6d or, with one of the said alternative techniques as above-described for the first method of manufacturing a photodetecting device), and having removed the remaining part 5' of the first substrate 5, via holes 40 are formed from the surface of the photosensitive layer 1 to inputs of some electronic components of the central part 22 of the photosensitive layer 2, passing through the optional first electrode layer 7 and the isolation layer 3 (with techniques similar to those used referring to FIG. 6m).

Figure 7A:
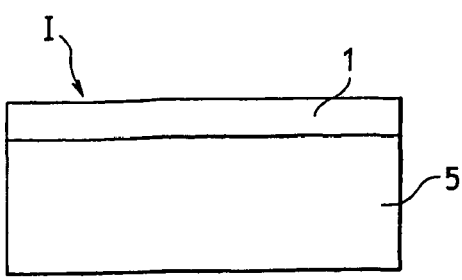
FIGS. 7a to 7h are different steps of a second method of manufacturing the second photodetecting device according to the invention.
Figure 7B:
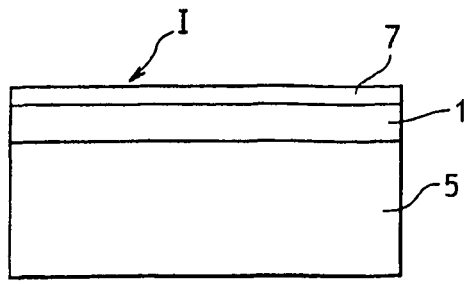
Figure 7C:
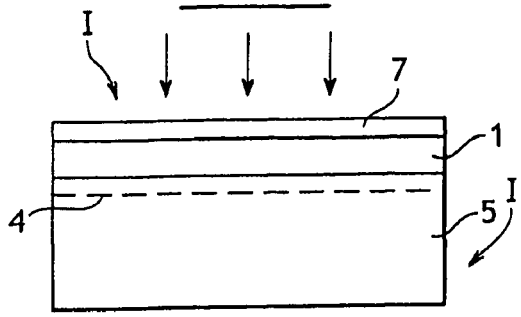
Figure 7D:
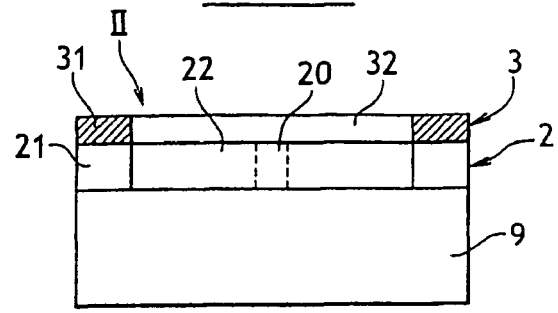
Figure 7E:
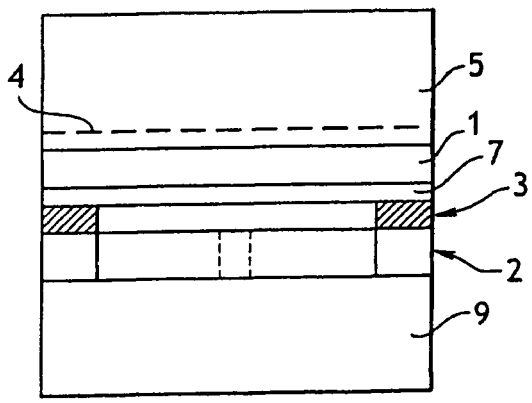
Figure 7F:
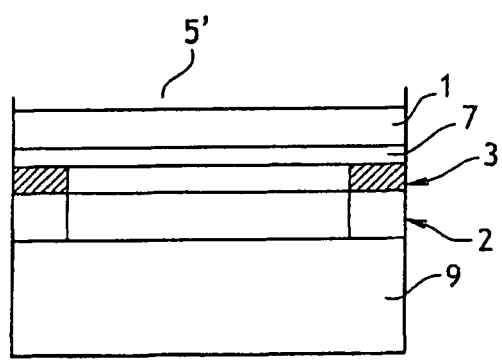
Figure 7G:
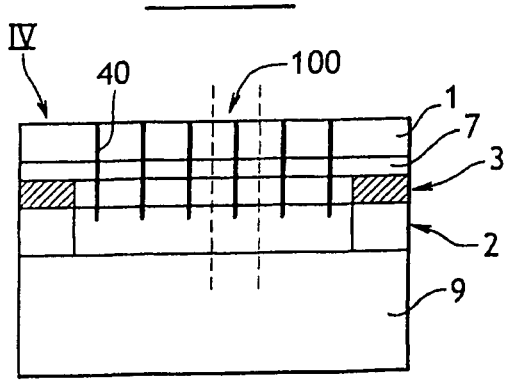
Figure 7H:
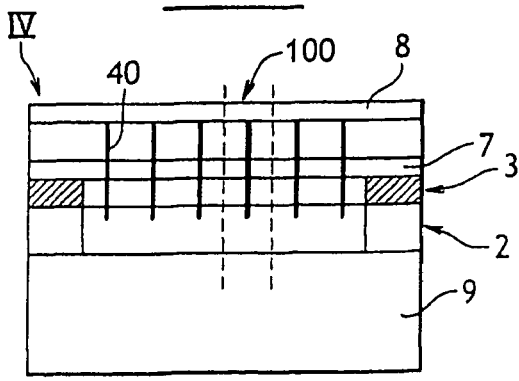

Referring to FIG. 7h, an optional second electrode layer 8 is formed on the photosensitive layer 1, with a transparent conductive material such as ITO, so that at least a part of the photons to be received can cross it. The second detecting device (referring to FIG. 5) is then formed.

The documents cited herein are incorporated by reference to the extent necessary to understand the features disclosed therein.

What is claimed is:

1. A method of manufacturing a photodetecting device, which comprises:
providing a first wafer that includes a photosensitive layer made of a semiconductor material and a second wafer that includes a circuit layer of electronic components, with one of the photosensitive layer or the circuit layer incorporating a field isolation layer;
bonding the first and second wafers to form a structure comprising successively the circuit layer, the field isolation layer and the photosensitive layer, and
forming electrically conductive vias to electrically connect the photosensitive layer to at least some of the electronic components of the circuit layer;
wherein the first wafer is formed by forming the photosensitive layer on a first substrate; bonding the photosensitive layer with a holding substrate of a transparent material on the photoreceptive side of the photosensitive layer; and removing the first substrate to provide the first wafer comprising the photosensitive layer and the holding substrate.

2. The method of claim 1, wherein the transparent material is quartz or glass.

3. The method of claim 1, which further comprises, prior to bonding with the holding substrate, forming a first electrode layer made of a transparent electrical conductive material on the photosensitive layer; and forming a second electrode layer made of an electrical conductive material on the first substrate after removing the first substrate so that the first wafer comprises the first and the second electrode layers.

4. The method of claim 1, wherein the second wafer is formed by forming the circuit layer on a second substrate, and removing the second substrate after bonding.

5. The method of claim 1, wherein the via holes are formed through the circuit layer to the photosensitive layer from inputs of some of the electronic components.

6. The method of claim 1, wherein the first substrate is removed by chemical etching, selective chemical etching, grinding, polishing or CMP.

7. The method of claim 1, wherein the first substrate includes an embrittlement zone and the first substrate is removed by applying energy for detaching the substrate at the embrittlement zone.

8. The method of claim 7, wherein the embrittlement zone is formed in the first substrate by implantation of atomic species.

9. The method of claim 7, wherein the embrittlement zone is formed by providing third and fourth wafers; etching a surface of at least one of the third and fourth wafers in order to increase surface roughness; bonding the third and fourth wafers at the rough surface(s) with the bonded rough surfaces forming the embrittlement zone.

10. The method of claim 7, which further comprises a surface finishing step of the detached surface employing selective chemical etching, polishing, CMP, oxidation, or a thermal anneal.

11. The method of claim 1, wherein the photosensitive layer is formed on the first substrate by crystal growth or doping.

12. The method of claim 1, which further comprises forming the field isolation layer on the photosensitive layer or on the circuit layer by forming a shielding to photons in periphery of the field isolation layer over a determinate width.

13. The method of claim 1, wherein the circuit layer comprises a plurality of transistors, and is patterned such that the vias are formed when parts of the photosensitive layer are electrically connected to some of the transistors by a conductive via, thus forming a plurality of photodetecting units or pixels.

14. The method of claim 13, wherein the electronic components and pixels comprise a CMOS component.

15. The method of claim 1, wherein the bonding is conducted by molecular adhesion.

16. The method of claim 15, which further comprises a thermal treatment conducted after the molecular adhesion to improve bonding of the field isolation zone.

17. The method of claim 1, wherein the field isolation zone is made of a dielectric material.

18. The method of claim 17, wherein the field isolation zone is made of $SiO_2$, $Si_3N_4$ or $Si_xO_yN_z$.

19. A method of manufacturing a photodetecting device, which comprises:
providing a first wafer that includes a photosensitive layer made of a semiconductor material and a second wafer that includes a circuit layer of electronic components, with one of the photosensitive layer or the circuit layer incorporating a field isolation layer;

bonding the first and second wafers to form a structure comprising successively the circuit layer, the field isolation layer and the photosensitive layer; and forming electrically conductive vias to electrically connect the photosensitive layer to at least some of the electronic components of the circuit layer;

wherein the first wafer is provided by forming the photosensitive layer on a first substrate, and then removing the first substrate after bonding.

20. The method of claim 19, which further comprises forming a first electrode layer made of an electrical conductive material on the photosensitive layer of the first wafer prior to removing the first substrate, and then forming a second electrode layer made of a transparent electrical conductive material on the photosensitive layer to provide the first wafer with the first and the second electrode layers.

21. The method of claim 20, wherein the via holes are formed through the surface of the photosensitive layer to inputs of some of the electronic components of the circuit layer and the transparent electrical conductive material is indium tin oxide.

22. The method of claim 19, wherein the bonding is conducted by molecular adhesion.

23. The method of claim 22, which further comprises a thermal treatment conducted after the molecular adhesion to improve bonding of the field isolation zone.

24. The method of claim 19, wherein the field isolation zone is made of a dielectric material.

25. The method of claim 19, wherein the field isolation zone is made of $SiO_2$, $Si_3N_4$ or $Si_xO_yN_z$.

* * * * *